United States Patent
Thirunavukarasu et al.

(10) Patent No.: US 10,262,877 B2
(45) Date of Patent: Apr. 16, 2019

(54) APPARATUS AND METHOD FOR REDUCING SUBSTRATE SLIDING IN PROCESS CHAMBERS

(71) Applicant: APPLIED MATERIALS, INC., Santa Clara, CA (US)

(72) Inventors: Sriskantharajah Thirunavukarasu, Singapore (SG); Kirankumar Savandaiah, Bangalore (IN); Cheng-Hsiung Tsai, Cupertino, CA (US); Kai Liang Liew, Singapore (SG)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/457,981

(22) Filed: Mar. 13, 2017

(65) Prior Publication Data

US 2017/0186631 A1 Jun. 29, 2017

Related U.S. Application Data

(62) Division of application No. 14/752,245, filed on Jun. 26, 2015, now Pat. No. 9,595,464.

(Continued)

(51) Int. Cl.
*H01L 21/67* (2006.01)
*H01L 21/687* (2006.01)
(Continued)

(52) U.S. Cl.
CPC ........ *H01L 21/67069* (2013.01); *C23C 14/50* (2013.01); *C23C 16/458* (2013.01); *C23C 16/4586* (2013.01); *C23C 16/50* (2013.01); *H01J 37/32009* (2013.01); *H01J 37/32082* (2013.01); *H01J 37/32577* (2013.01);
(Continued)

(58) Field of Classification Search
None
See application file for complete search history.

(56) References Cited

U.S. PATENT DOCUMENTS 5,904,779 A * 5/1999 Dhindsa ............ H01J 37/32431
118/723 E
2002/0170498 A1 11/2002 Paik
(Continued)

OTHER PUBLICATIONS

International Search Report and Written Opinion dated Oct. 28, 2015 for PCT Application No. PCT/US2015/040913.

(Continued)

*Primary Examiner* — Jiong-Ping Liu
(74) *Attorney, Agent, or Firm* — Moser Taboada; Alan Taboada

(57) ABSTRACT

Methods and apparatus for processing a substrate are disclosed herein. In some embodiments, an apparatus for processing a substrate includes: a substrate support having a substrate supporting surface including an electrically insulating coating; a substrate lift mechanism including a plurality of lift pins configured to move between a first position disposed beneath the substrate supporting surface and a second position disposed above the substrate supporting surface; and a connector configured to selectively provide an electrical connection between the substrate support and the substrate lift mechanism before the plurality of lift pins reach a plane of the substrate supporting surface.

7 Claims, 3 Drawing Sheets

Related U.S. Application Data

(60) Provisional application No. 62/026,641, filed on Jul. 19, 2014.

(51) Int. Cl.
    *H01L 21/306*     (2006.01)
    *C23C 16/50*     (2006.01)
    *C23C 14/50*     (2006.01)
    *C23C 16/458*     (2006.01)
    *H01J 37/32*     (2006.01)
    *H01L 21/683*     (2006.01)
    *H01J 37/34*     (2006.01)

(52) U.S. Cl.
    CPC ........ *H01J 37/3405* (2013.01); *H01L 21/306* (2013.01); *H01L 21/67103* (2013.01); *H01L 21/6833* (2013.01); *H01L 21/68742* (2013.01); *H01L 21/68757* (2013.01); *H01J 2237/334* (2013.01); *H01J 2237/3321* (2013.01)

(56) References Cited

U.S. PATENT DOCUMENTS

| | | |
|---|---|---|
| 2004/0223286 A1 | 11/2004 | Chu et al. |
| 2006/0151117 A1 | 7/2006 | Kasanami et al. |
| 2008/0194169 A1 | 8/2008 | Sterling et al. |
| 2009/0226611 A1 | 9/2009 | Suzuki et al. |
| 2010/0071624 A1 | 3/2010 | Lee |
| 2010/0218785 A1 | 9/2010 | Green et al. |
| 2011/0092072 A1 | 4/2011 | Singh et al. |
| 2012/0193071 A1 | 8/2012 | Tsunekawa et al. |

OTHER PUBLICATIONS

Search Report for Taiwan Invention Patent Application No. 104123113 dated Nov. 20, 2018.

\* cited by examiner

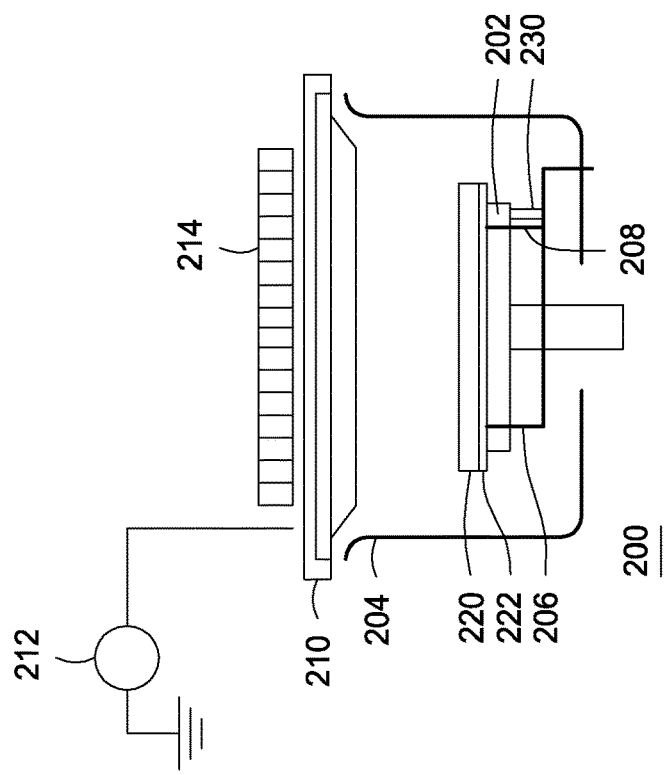
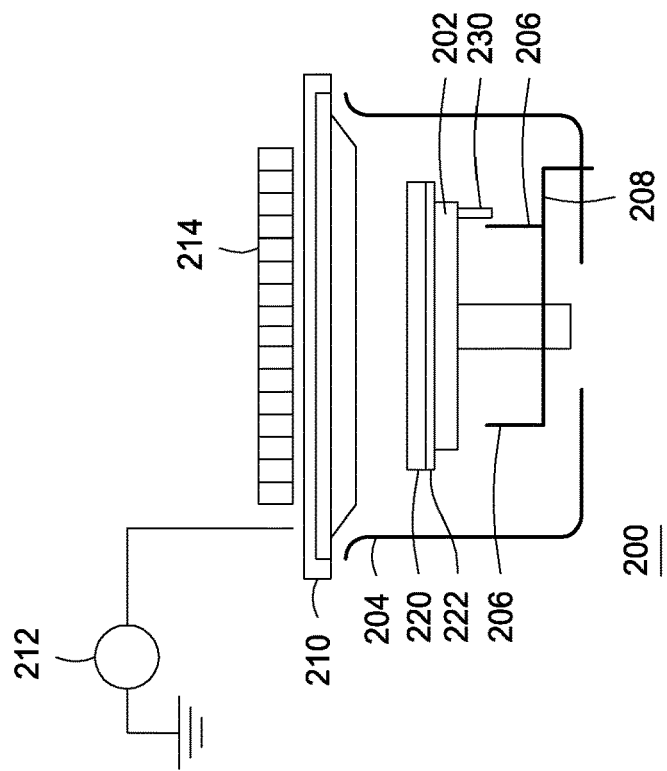

APPARATUS AND METHOD FOR REDUCING SUBSTRATE SLIDING IN PROCESS CHAMBERS

CROSS-REFERENCE TO RELATED APPLICATIONS

This application is a divisional of co-pending U.S. patent application Ser. No. 14/752,245, filed Jun. 26, 2015, which claims benefit of U.S. provisional patent application Ser. No. 62/026,641, filed Jul. 19, 2014. Each of the aforementioned related patent applications is herein incorporated by reference in their entireties.

FIELD

Embodiments of the present disclosure generally relate to a substrate processing system and, more particularly, to apparatus and methods for processing substrates having a back oxide layer.

BACKGROUND

In the processing of substrates, such as semiconductor wafers, a substrate is placed on a substrate support in a process chamber of a substrate processing system. The support for the substrate is often a support member, such as a heater pedestal, to hold the substrate in proper position during the processes performed. Typically, the substrate is placed on the support member and generally centered with respect to the support member for the substrate to be processed uniformly. One or more processes, such as plasma processes or other processes, are then carried out on the substrate. After completion of the one or more processes, the substrate is then removed from the substrate support, for example, using lift pins that may be displaceable in a direction perpendicular to the plane of the substrate support. The lift pins move relative to the substrate to lift the substrate off of the substrate support for subsequent removal of the substrate from the process chamber.

The inventors have observed that, in some processes, the substrate may undesirably move on the substrate support when attempting to lift the substrate after completion of the process. Specifically, the inventors have observed that the substrate may undesirably move upon attempting to lift the substrate after completion of some processes carried out on a substrate having a thick back oxide layer (such as a thickness of about 10 kÅ or more) disposed on a substrate support with the back oxide layer contacting the substrate support.

Accordingly, the inventors have provided embodiments of improved methods and apparatus for processing substrates in a process chamber.

SUMMARY

Methods and apparatus for processing a substrate are disclosed herein. In some embodiments, an apparatus for processing a substrate includes: a substrate support having a substrate supporting surface including an electrically insulating coating; a substrate lift mechanism including a plurality of lift pins configured to move between a first position disposed beneath the substrate supporting surface and a second position disposed above the substrate supporting surface; and a connector configured to selectively provide an electrical connection between the substrate support and the substrate lift mechanism before the plurality of lift pins reach a plane of the substrate supporting surface.

In some embodiments, an apparatus for processing a substrate includes a substrate support that supports and contacts at least part of a first surface of the substrate while a process is carried out on a second surface of the substrate, the substrate support being electrically isolated while the process is carried out; a substrate lift mechanism which is apart from the substrate while the process is carried out and which subsequently contacts the first surface of the substrate; and a connector which provides an electrical connection between the substrate support and the substrate lift mechanism at a time after the process is ended but before the substrate lift mechanism contacts the first surface of the substrate so that a potential difference between the first surface of the substrate and the substrate lift mechanism is removed.

In some embodiments, an apparatus for processing a substrate includes: a process chamber; a substrate support disposed within the process chamber, the substrate support having a substrate supporting surface including an electrically insulating coating; a substrate lift mechanism including a plurality of lift pins configured to move between a first position disposed beneath the substrate supporting surface and a second position disposed above the substrate supporting surface; a connector configured to selectively provide an electrical connection between the substrate support and the substrate lift mechanism before the plurality of lift pins reach a plane of the substrate supporting surface; and a plasma power source to generate a plasma within the process chamber.

In some embodiments, an apparatus for processing a substrate includes a connector which provides an electrical connection between a substrate lift mechanism and a first surface of the substrate at a time after a process carried out on a second surface of the substrate is ended, wherein at least part of the first surface of the substrate is supported by and in contact with a substrate support while the process is carried out, the substrate support is electrically isolated while the process is carried out, and the substrate lift mechanism is apart from the substrate while the process is carried out.

In some embodiments, a method of processing a substrate includes performing a process on a substrate disposed on a substrate support, wherein the substrate support is electrically isolated while the process is performed; after the process has ended, electrically coupling the substrate support and a substrate lift mechanism to reduce or remove a potential difference between the substrate support and the substrate lift mechanism; and subsequently contacting the substrate with the substrate lift mechanism.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

FIGS. 2A and 2B illustrate an example of a process chamber in accordance with some embodiments of the present disclosure.

Figure 1:
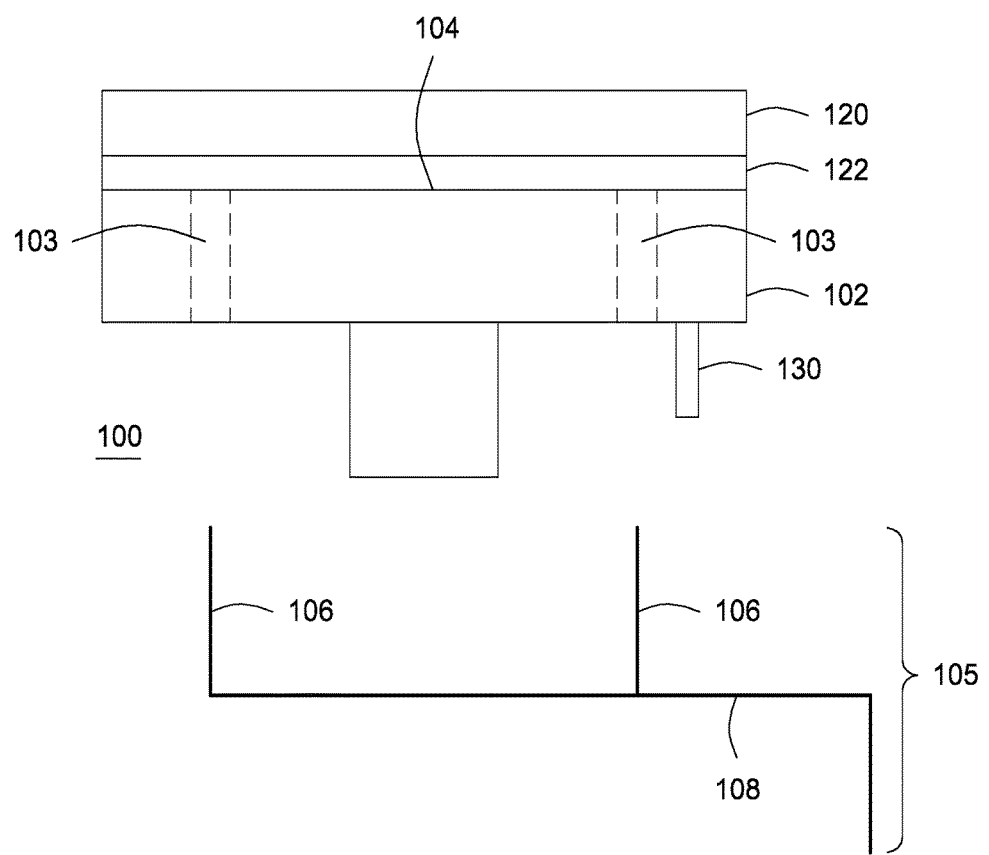
FIG. 1 shows an example of a substrate support and substrate lift mechanism in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of the present disclosure relate to methods and apparatus that advantageously prevent substrate movement on a substrate support due to voltage differences between a substrate lift mechanism and the substrate after completion of processing. While not limiting of the scope of the disclosure, embodiments of the present disclosure may be useful in addressing the problem of the shifting of substrates, such as semiconductor wafers, having a thick back oxide layer (e.g., a back oxide having a thickness of about 10 kÅ or thicker) after completion of a process, for example, a plasma process, in a process chamber.

The inventors have observed that a substrate centered on a substrate support may remain centered throughout a process and immediately after completion of the process. The inventors have further observed that the substrate sometimes laterally shifts undesirably when lift pins contact the substrate after completion of a plasma process, but do not shift when touched by the lift pins after a non-plasma process is completed. The inventors also observed such a shift does not occur when a thin back oxide wafer was plasma processed. The inventors therefore concluded that the combination of the thick back oxide layer of the substrate, the plasma process, and contact with the lift pins causes the shift in position of the substrate.

More specifically, the inventors believe that the self-bias of the DC plasma provides an electric field that, when applied to the substrate during a plasma process, results in dielectric polarization of the thick back oxide layer. That is, positive charges are displaced within the thick back oxide layer in a direction toward the electric field and negative charges are displaced within the thick back oxide layer in a direction away from the electric field. The thick back oxide layer remains polarized at the end of the plasma process because the surface of the substrate support that contacted the substrate was coated with an electrically insulating coating, such as a DYLYN® diamond-like carbon (DLC) coating or the like. Such coatings may be used to prevent thermal mismatches between the substrate and the substrate support and reduce stress in the substrate. The electrically insulating coating, the inventors noted, prevents the electrical charges built up in the thick back oxide layer from dissipating through the substrate support. Though the charge build-up in the thick back oxide layer could theoretically dissipate through micro-cracks in the substrate by waiting before the lift pin contacts the substrate, the time wasted is much longer than is desired for a manufacturing process.

As a result of the charge build-up, a potential difference remains across the thick back oxide layer after completion of the process which, when the substrate is contacted by the lift pins, causes the substrate to be electrostatically repelled and slide away from the centered position.

In some embodiments, the aforementioned problem may be addressed by removing the electrically insulating coating from the substrate supporting surface of the substrate support. For example, the substrate supporting surface of the substrate support may be coated with a coating, such as DYLYN®, to prevent thermal mismatches between the substrate and the substrate support, as described above, and the coating is removed from the substrate supporting surface. By removing the electrically insulating coating from the substrate supporting surface, the substrate directly contacts the substrate support, which is a conductor; so that any charge build-up on the surface of the thick back oxide layer is dissipated. As another example, the substrate supporting surface of the substrate support may be coated with both the above-described DYLYN® coating and a titanium coating, and both of these coatings are removed from the substrate supporting surface of the substrate support which further reduces the charge built-up on the surface of the thick back oxide layer.

The inventors determined that when a plasma process is performed on a substrate disposed on a substrate supporting surface from which the electrically insulating coating was removed, there is a substantial reduction of the sliding of the substrate upon contact with the lift pins. The inventors further determined that, for the example of a semiconductor wafer, the removal of the electrically insulating coating from the substrate support did not detrimentally affect the substrate stress significantly after the process was carried out.

The inventors further addressed the problem of post-process substrate sliding by incorporating a connector, such as a grounding loop, in a manner that equalized the potential of the substrate support and the lift pins, and hence equalized the potential of the thick back oxide layer and the lift pins, at a time after completion of the process on the substrate but before the lift pins contacted the substrate. By removing the potential difference, the sliding of the substrate upon contact with the lift pins was further reduced.

FIG. 1 illustrates a non-limiting example 100 of substrate support in accordance with some embodiments of the disclosure. A substrate support 102 has a substrate supporting surface 104. In some embodiments, the substrate support may also include a heater 110, such as a resistive heater. In some embodiments, an existing substrate support having an electrically insulating coating, such as a DYLYN® coating as described above, may have the electrically insulating coating removed. A substrate 120 may have a dielectric backside coating, such as a thick (e.g., greater than about 10 kÅ) back oxide layer 122 which is in contact with the substrate supporting surface 104 of the substrate support 102.

A substrate lift mechanism 105 includes, for example, a plurality of lift pins 106, each of which is attached at to a hoop ring 108 a base of the respective lift pins. The substrate support has a plurality of corresponding openings 103 into which the lift pins 106 may enter. The substrate lift mechanism 105 is movable between a first position disposed apart from the substrate support 102 and the substrate 120 when the substrate 120 is disposed on the substrate support 102, and a second position in contact with the first surface of the substrate 120 to support the substrate 120 in a spaced apart relation to the substrate support 102 (e.g., to facilitate transfer of the substrate to or from a substrate transfer robot).

A connector, such as a grounding strip 130, is electrically coupled, for example, at the bottom of the substrate support 102 and is brought, by relative movement of the substrate support 102 and the substrate lift mechanism 105, into electrical contact with the top surface of the substrate lift mechanism 105 (e.g., the hoop ring 108) before the substrate lift mechanism 105 contacts the second surface of the substrate 120. In another example, the connector is electrically coupled at the top surface of the substrate lift mechanism 105 (for example a top surface of the hoop ring 108) and is brought, by the relative movement of the substrate support and the substrate lift mechanism, into electrical contact with the bottom surface of the substrate support. By providing an electrical connection between the substrate support and the substrate lift mechanism, the connector reduces or removes any potential difference between the substrate support and the substrate lift mechanism which, when the substrate lift mechanism contacts the second surface of the substrate, minimizes any sliding of the substrate from the center of the substrate support.

In some embodiments, the grounding strip 130 may be a flexible member, such as a thin hoop, or ring, of material (e.g., a grounding loop, for example, a flexible metal band formed into a ring). The flexible grounding strip 130 can move, such as by elastic deformation, to facilitate continued movement of the substrate support 102 and the substrate lift mechanism 105 with respect to each other when moving the lift pins of the substrate lift mechanism 105 to contact the substrate and remove the substrate from the substrate supporting surface of the substrate support 102.

FIGS. 2A and 2B show a non-limiting example of a process chamber 200 having a substrate support 202 in accordance with some embodiments of the present disclosure. Although the substrate support 202 is described below as used in a physical vapor deposition (PVD) process chamber, the substrate support 202 may be used to advantage in other process chambers where plasma processing or other conditions result in a voltage potential difference between the substrate and lift pins of the substrate support.

The substrate support 202 is disposed within a processing volume of the process chamber 200 and is formed of a conductive material. A connector, such as a grounding strip 230, is electrically coupled, for example, at the bottom of the substrate support 202. A substrate lift mechanism includes, for example, lift pins 206 each of which is attached to a hoop ring 208 at a base of the respective lift pins. In addition to the details discussed below, one or more of the substrate support 202, the grounding strip 230, and the substrate lift mechanism may be similar to the substrate support 102, the grounding strip 130, and the substrate lift mechanism 105 described above in connection with FIG. 1.

The substrate support 202 and the substrate lift mechanism are each contained within chamber walls 204 and beneath a lid assembly 210. The lid assembly 210 may include a target of material to be sputter deposited on a substrate disposed on the substrate support 202. In some embodiments, a plasma power source, such as a DC power supply 212 provides power to generate a plasma within the process chamber from one or more gases supplied to the chamber via a gas supply (not shown). In some embodiments, the plasma power source is coupled to the target through the lid assembly 210. A magnet 214 is used to confine the plasma proximate the target to enhance processing, such as target uniformity of utilization, sputter rate, target lifetime, and the like. Alternatively or in combination, an RF power supply may be used in place of, or together with, the DC power supply 212 to provide power to generate the plasma.

FIG. 2A shows the process chamber 200 at the completion of a process on a first surface of a substrate 220, such as a semiconductor wafer, having a second surface which is disposed atop, and which contacts, a substrate supporting surface of the substrate support 202. The substrate 220 also includes, for example, a thick back oxide layer 222 which, as an example, has a thickness of at least 10 kÅ. The process, for example, is a plasma process such as a physical vapor deposition (PVD) process, a chemical vapor deposition (CVD) process, a reactive ion etch (RIE) or other etch process, or other plasma process.

After completion of the process on the first surface of the substrate 220, the substrate support and the substrate lift mechanism move relative to each other, such as by either the substrate support translating downward, the substrate lift mechanism are translating upward, or both the substrate support translating downward and the substrate lift mechanism translating upward. The relative movement of the substrate support and the substrate lift mechanism is carried out to transfer the substrate from the substrate support to the substrate lift mechanism so that the substrate may be transferred from the process chamber, such as by using a substrate transfer robot.

FIG. 2B shows an example of the process chamber 200 of FIG. 2A after the connector 230 has been brought into electrical contact with the substrate lift mechanism and after the substrate lift mechanism has contacted the substrate. As shown in FIG. 2B, the substrate was found to remain substantially at the center of the substrate support.

Figure 3:
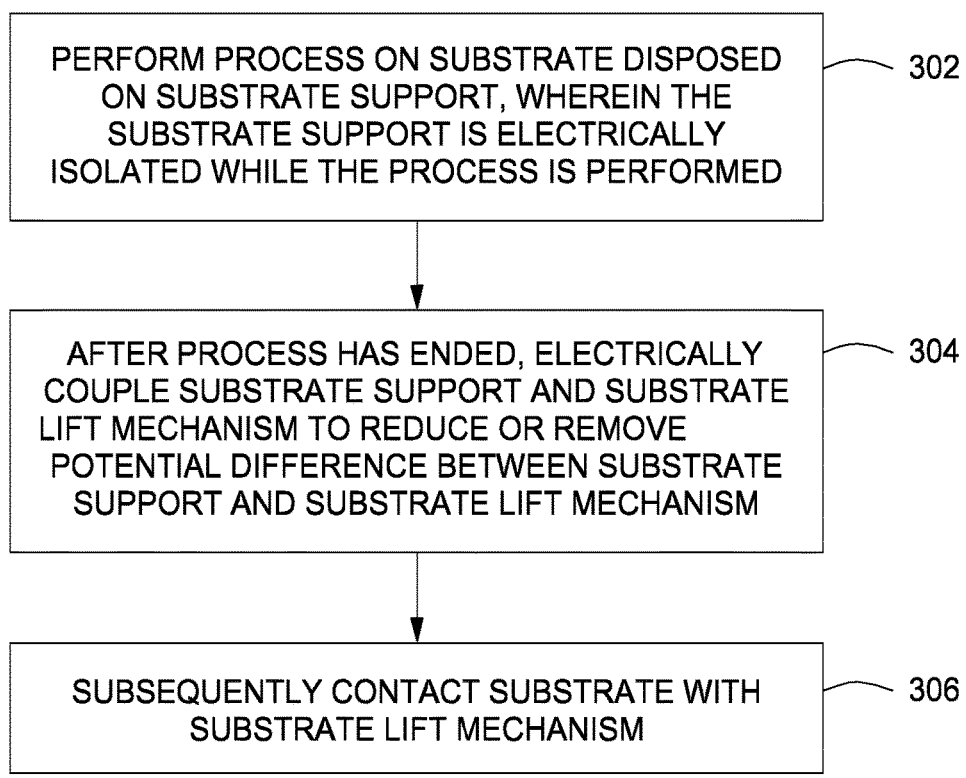
FIG. 3 is a flow diagram illustrating an example of a method in accordance with some embodiments of the present disclosure.

FIG. 3 illustrates an example of a method 300 of processing a substrate according to some embodiments of the present disclosure. The method 300 may be carried out in a process chamber having a substrate support similar to that described in FIG. 1 or FIGS. 2A-B or other suitable process chamber and substrate support in accordance with the above teachings.

The method 300 generally begins at 302, where a process is carried out on a substrate while the substrate is supported by the substrate support. The substrate support is electrically isolated while the process is carried out. Next, at 304, after the process has ended, the substrate support and a substrate lift mechanism are electrically coupled to reduce or remove any potential difference between the substrate and the substrate lift mechanism. For example, at least one of the substrate support or the substrate lift mechanism is moved relative to at least another of the substrate support or the substrate lift mechanism until a connector electrically coupled to one of the substrate support or the substrate lift mechanism is brought into electrical contact with another of the substrate support or the substrate lift mechanism. Then, at 306, the substrate is brought into contact with the substrate lift mechanism, such as by further relative movement of the at least one of the substrate support or the substrate lift mechanism, to lift the substrate from the substrate support.

While the foregoing is directed to embodiments of the present disclosure, other and further embodiments of the disclosure may be devised without departing from the basic scope thereof.

The invention claimed is:

1. A method of processing a substrate, comprising:
performing a process on a substrate disposed on a substrate support, wherein the substrate support is electrically isolated from a substrate lift mechanism while the process is performed;
after the process has ended, electrically coupling the substrate support and the substrate lift mechanism to reduce or remove a potential difference between the substrate support and the substrate lift mechanism; and
subsequently contacting the substrate with the substrate lift mechanism.

2. The method of claim 1, wherein the process includes a plasma process.

3. The method of claim 1, wherein the process is a physical vapor deposition (PVD) process, a chemical vapor deposition (CVD) process, or an etch process.

4. The method of claim 1, further comprising:
   prior to performing the process on the substrate, removing an electrically insulating layer from the substrate support so that the substrate is in electrical contact with the substrate support while performing the process.

5. The method of claim 1, wherein an oxide layer is disposed on at least part of a first surface of the substrate in contact with the substrate support so that electrical charge accumulates at the at least part of the first surface of the substrate while the process is carried out.

6. The method of claim 5, wherein the oxide layer has a thickness of at least 10 kÅ.

7. The method of claim 1, wherein the substrate is a semiconductor wafer.

* * * * *